United States Patent
Gidon

(10) Patent No.: US 6,423,573 B1
(45) Date of Patent: Jul. 23, 2002

(54) INTEGRATED ELECTRONIC CIRCUIT COMPRISING AT LEAST AN ELECTRONIC POWER COMPONENT

(75) Inventor: Pierre Gidon, Echirolles (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/530,034

(22) Filed: Apr. 24, 2000

(30) Foreign Application Priority Data

Aug. 25, 1998 (FR) ............................................. 98 10688

(51) Int. Cl.[7] ...................... H01L 21/44; H01L 21/48; H01L 21/50
(52) U.S. Cl. .................................... 438/113; 438/460
(58) Field of Search ............................... 438/113, 221, 438/270, 359, 424, 460, 637, 672, 675

(56) References Cited

U.S. PATENT DOCUMENTS

| | | | | |
|---|---|---|---|---|
| 3,577,037 A | * | 5/1971 | Di Pietro et al. ............ 317/101 |
| 5,131,584 A | * | 7/1992 | Boitel et al. .............. 228/180.2 |
| 5,264,699 A | * | 11/1993 | Barton et al. ............. 250/338.4 |
| 5,308,980 A | * | 5/1994 | Barton .................... 250/338.4 |
| 5,574,285 A | * | 11/1996 | Marion et al. ........... 250/370.13 |
| 5,968,389 A | * | 10/1999 | Marion et al. ............... 219/404 |

FOREIGN PATENT DOCUMENTS

| EP | 662721 | 7/1995 | ....... H01L/31/0203 |
|---|---|---|---|
| FR | 2012333 | 3/1970 | ........... H01L/19/00 |
| GB | 1467354 | 3/1977 | ........... H01L/21/78 |
| WO | WO 95/19645 | 7/1995 | ......... H01L/23/485 |

* cited by examiner

Primary Examiner—David Nelms
Assistant Examiner—David Nhu
(74) Attorney, Agent, or Firm—Hayes Soloway P.C.

(57) ABSTRACT

A method of producing an integrated circuit having a plurality of electronic components by the steps of:
a) forming plurality of components with connection points in a substrate plate;
b) forming a connection support of conducting tracks;
c) transferring the substrate plate onto the connection support connecting the connection points with the conducting tracks;
d) forming at least one separation trench in the substrate plate, surrounding a portion of substrate having at least one electronic component, in a way that separates it from the other components in the plate; and
e) filling the trenches with a dielectric material.

12 Claims, 3 Drawing Sheets

INTEGRATED ELECTRONIC CIRCUIT COMPRISING AT LEAST AN ELECTRONIC POWER COMPONENT

BACKGROUND OF THE INVENTION

1. Field of the Invention

This invention relates to an electronic circuit and a method of producing an integrated electronic circuit comprising at least one electronic component, in particular a power electronic component, in a substrate plate.

In the sense of this invention, by electronic component, one understands both an individual component such as a diode, or a transistor and an operational assembly of components such as an amplification stage or a logic switching unit.

In addition, by component, one understands by power component, a component through which large currents are able to pass or a component capable of receiving at its terminals, high voltages. Such components are, for example, diodes, transistors, and thyristors capable of operating at voltages which, depending on the application, can reach several thousands of volts and/or through which currents of several tens of amps can pass.

The invention finds application in the manufacture of electric motor control circuits, protection circuits, such as circuit breaker circuits, power limiters or regulators, or in circuits that combine logic switching stages and power switching stages.

2. Description of the Prior Art

The integrated circuits for controlling motors or power regulation circuits generally comprise one or more power components that can occupy a large area on an integration substrate of up to several mm$^2$ per component. It also comprises electronic command components connected to the power components, the command components operating at low voltage and with a low current.

The imperatives of manufacturing cost and the space occupied lead one to bring together the power components and the other components of the circuit into a single monolithic unit capable of being manufactured in accordance with collective process techniques.

The manufacture of monolithic units that integrate all the components of a circuit, generally comprises the integration of the power components and the other components into one and the same substrate plate.

This integration then poses problems of electrical insulation which require either modification of the components themselves, favoring manufacturing techniques for the components at the surface, to the detriment of manufacturing within the thickness of the substrate plate, or demands complicated preparation of the substrates before the production of the components.

This preparation work for electrical insulation may comprise the diffusion of doping impurities, at high temperature, into the substrate plate so as to form junction barriers. According to other techniques, the insulation can be provided by creating dielectric walls (enclosures) within the substrate before integrating the components into it.

Modification of the components themselves or preparation of the substrate involve complex and expensive operations which are generally not very compatible with the demands of high manufacturing output performance and of high density integration of components.

BRIEF DESCRIPTION OF THE INVENTION

The aim of this invention is to provide a method of manufacturing an integrated electronic circuit that can comprise both power electronic components and other electronic components and does not have the difficulties mentioned above.

A particular aim is to provide such a method which does not impose any restriction whatsoever on the manufacture or the modification of the components themselves in order to achieve their mutual electrical installation.

Another aim is to provide a method that enables the integration of all the components into one and the same substrate without any particular preparation of the substrate.

A further aim is to provide a method that makes possible more effective insulation of components operating at high voltage and components operating at low voltage.

Another aim is to provide a method that permits the production of monolithic units comprising all the components of an electronic circuit, the external faces of which are substantially free of connection terminals. The absence of connection terminals on the external faces offers the possibility of fitting radiator units for heat dissipation.

Yet another aim of the invention is to provide such a method that allows collective and simultaneous manufacture of a large number of identical electronic circuits.

In order to achieve these aims, the invention provides a method of producing an integrated circuit comprising a plurality of electrical components, one or more of which are, for example power components. The method comprises the following successive steps:

a) forming a plurality of components in a substrate plate, and forming connection points for said components, on a first face of the substrate plate, b) forming on a connection support conducting tracks according to a pattern that corresponds with connection points distribution on the substrate plate, c) transferring the substrate plate onto the connection support, electrically connecting the connection points with the corresponding conducting tracks, d) forming at least one separation trench in the substrate plate, surrounding at least one portion of substrate that includes at least one electronic component, in a way that separates it from other electronic components in the substrate plate, the separation trench passing right through the substrate plate without reaching the connections support, and e) filling the trenches with a dielectric material.

The formation of separation trenches combined with their filling with a dielectric material allows one effectively to insulate the various portions of substrate that each include one or more electronic components. In particular it is possible to mutually insulate portions of substrate that include power components, in particular high voltage power components, and portions of substrate that include components operating at low voltage.

This particular feature of the invention allows one initially to produce all the components in one and the same substrate plate without worrying about their electrical insulation. Hence, the methods of manufacturing the components can be chosen freely and in relation to imperatives other than the electrical insulation, and the substrate plate does not require any special preparation.

Furthermore, as the formation of the trenches is subsequent to transfer of the substrate plate onto the connection support, the connection of all the components can take place in a collective and simultaneous fashion.

This particular feature is advantageous notably within the context of industrial manufacture of integrated circuits.

According to one particular embodiment of the method, before step c), flaring grooves can be made in the substrate plate for the trenches in places where it is intended to form trenches in step d).

Flaring the ends of the trenches enables one to prevent the edges of the portions of substrate plate on each side of the trenches forming sharp edges and concentrating an electric field that exists between the portions of the substrate plate. Hence the behavior at voltage between the different portions can be improved.

The flaring grooves can be made with chamfered edges, using a saw blade with an oblique edge. They may also be made by etching, giving the edges a rounded shape.

During step c) of the method, the contact points and the conducting tracks can be connected by a connection method chosen, for example, from connection through bosses of fusible material, connection through a conductive adhesive, or connection through eutectic soldering.

Connection through bosses and particularly through beads of fusible material is preferred particularly when the number of connection points for the components is high. Furthermore, the technique of connection through beads of fusible material, also known under the name of "Flip chip", permits transfer of the substrate plate onto the connection support with greater alignment tolerances. In effect, precise mutual positioning between the substrate plate and the support is automatically provided through the effect of surface tension forces which are exerted within the bead material, when it is molten.

When the connection is made through beads of fusible material, it is possible, during step e) of the method, for the dielectric material introduced through the trenches, to penetrate between the substrate plate and the connection support, so as to envelope said beads.

Putting dielectric material into all the free space between the substrate plate and the connection support allows one to control precisely the electrical insulation between the components and also between the beads of fusible material used as an electrical connection.

After the dielectric material has been put into place, the procedure can be completed by the formation of contact points and interconnection tracks on a second free face of the substrate plate, opposite said first face.

Such interconnection of components through the "back face" is particularly suggested for the power components.

Preferably, in order to make the connections on the second face of the substrate plate, it is desirable that this face has a flat surface. Also, putting the dielectric material into the trenches is done in such a way that the material is exactly flush with the surface of the second plate.

According to another advantageous aspect of the invention, the method can comprise, in addition, the laying bare of a part of the connection support, into which at least one conducting track connected to at least one of the components extends.

This characteristic permits access to conducting tracks for the purpose of making connections to the outside, and therefore of limiting or doing away with connection sockets on the free external faces of the substrate plate or the support.

These faces can then be brought into contact with radiators for the dissipation of the heat produced by the power components.

The invention also relates to an integrated circuit comprising a plurality of components, formed in portions of a substrate separated by trenches, a support plate for the portions of substrate, fitted with conducting tracks connected to the components, and a dielectric material extending within said trenches and, at least in part, between portions of the substrate and the support plate. Such a circuit can be obtained by the method described above.

It may comprise power components and logic switching components formed in different portions of the substrate.

Other characteristics and advantages of this invention will better emerge from the description which follows, and which refers to the figures of the appended drawings. This description is given purely for illustrative purposes only and is non-limitative.

DETAILED DESCRIPTION OF EMBODIMENTS OF THE INVENTION

Figure 1:
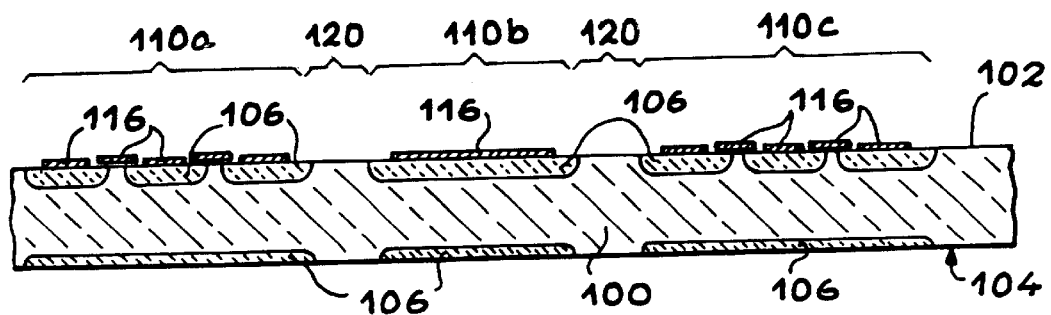
FIGS. 1 to 3 are simplified diagrammatic sections of a substrate plate and show steps for the preparation of the plate according to one particular embodiment of the method of the invention.

FIG. 1 shows, in section, a part of substrate plate 100, for example, made of silicon, having a first face 102 called the "front face" and a second face 104 called the "back face".

Doped regions 106 formed in the substrate plate from the front face and the back face permit the definition of different components or parts of components in the substrate plate.

In the example in the Figure, the part of the substrate plate shown comprises three components 110a, 110b, 110c which are, for example, an insulated gate bipolar transistor (IGBT), a diode and a second insulated gate bipolar transistor.

Reference number 116 in FIG. 1 designates without any differentiation between them, connection points formed on the front face of the substrate plate 100. The connection points can be points constituting contact points on the doped regions flush with the front face of the substrate or can be control gates, insulated from the front face by a thin layer of gate oxide, for example. The connection points are preferably made of a metal such as aluminum or an alloy such as AlSiCu or a stack of metal layers for example titanium, nickel and gold.

In FIG. 1, it can be observed that the doped regions 106 are formed in accordance with a layout such that the components 110a, 100b, 110c are not contiguous but are separated by areas 120, called separation areas in the text below.

Figure 2:
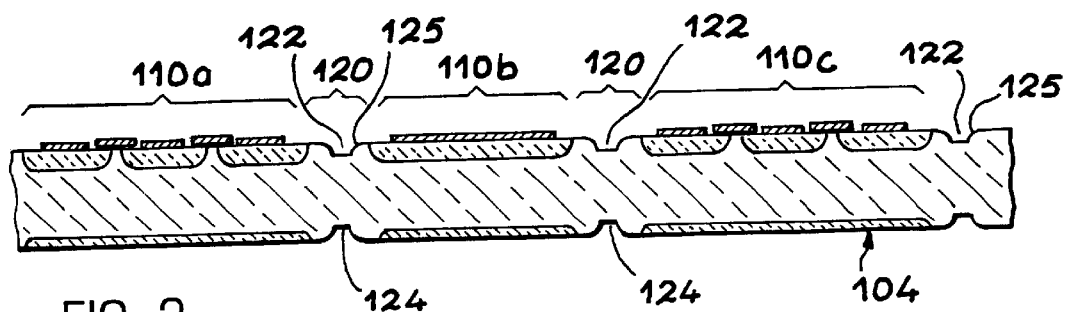

FIG. 2 illustrates the formation in the separation areas of grooves 122 extending respectively around components 110a, 100b 110c. The grooves have sides the edges of which are chamfered or rounded off 125. The grooves are intended to flare the ends of trenches made later in the substrate plate 100. Equivalent grooves 124 are also made in the back face 104, in such a way that they coincide with the grooves 122 in the front face.

It should be made clear that, in other possible embodiments of the method, the step of forming certain flaring grooves and the step of forming the trenches, described in the text that follows, can be inverted. In certain particular cases, the grooves on the back face and/or on the front face may not be necessary.

Figure 3:
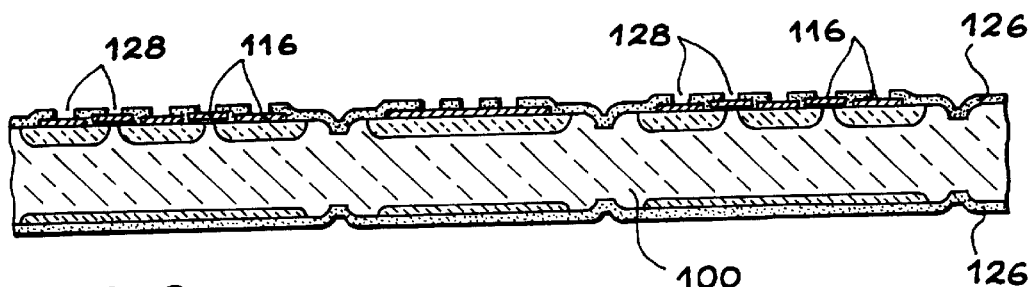

FIG. 3 shows the formation, on the front and back faces of the substrate plate, of a passivation layer 126 made of an electrically insulating material such as silica or polymer.

The formation of the passivation layer is followed by the creation of openings 128 in this layer, allowing one to lay bare, at least in part, a certain number of connection points 116. A plurality of openings can be made in the passivation layer above one and the same connection point 116 in a way that bares several parts of that point.

Figure 4:
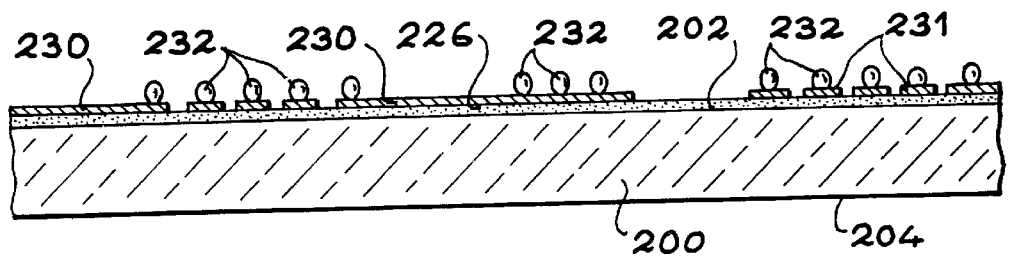
FIG. 4 is a simplified diagrammatic section of a connection support intended to be used for the implementation of the method.

FIG. 4 in the appended drawings shows the preparation of a connection support intended to receive the substrate plate with the components.

A support plate 200, otherwise called a connection support, is treated with a layer 226 of an electrically insulating material, on one of its faces 202, called the front face. By way of example, the plate 200 and the layer 226 can be made of materials such as silicon and silica respectively.

A metal layer formed on the layer 226 of electrically insulating material is formed so that conducting tracks 230 are defined, possibly including connection points 231.

In a particular embodiment where the material of the support plate 200 is an electrically insulating material, such as silica or alumina, the insulating layer 226 can be omitted.

The tracks 230, and the connection points 231 are then formed directly on the support plate.

The tracks and the connection points of the connection support 200 are formed in accordance with a pattern that corresponds with a connection point distribution on the substrate plate 100 described with reference to FIGS. 1 to 3.

Hence, the connection points of the support 200 are facing points associated with the substrate plate 100 when the plate is transferred onto the connection support.

A certain number of tracks, and more precisely the connection points of the tracks of the connection support are treated with beads of a fusible material 232. By fusible material, one understands a material such as an alloy: based on tin, lead and/or indium, capable of melting at a temperature that is relatively low.

Possibly, the positioning of the beads may be preceded by the formation, on the front face of the connection support, of a passivation layer which covers the conducting tracks but which has openings that permit the placing of beads of fusible material on the tracks. Such a passivation layer, which has not been shown in the Figure, for simplification reasons, enables better insulation to be provided between the tracks of the connection support and the substrate which is transferred to it later. It also enables any parasitic contact between neighboring tracks to be avoided and protects the tracks against chemical etching agents that might possibly be used in subsequent parts of the method.

Figure 5:
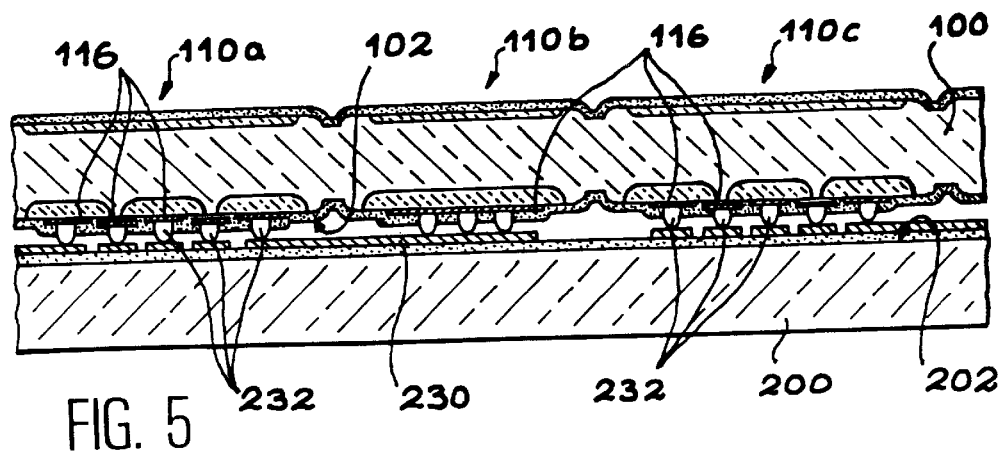
FIG. 5 is a simplified diagrammatic section of the substrate plate and the connection support illustrating the assembly of these parts.

The transfer of the substrate plate 100 onto the connection support is illustrated in FIG. 5. During assembly, the front face 102 of the substrate plate 100 is turned towards the front face 202 of the connection support in such a way that the beads of fusible material 232 come respectively into position on the connection points 116 of the substrate plate, which are associated with them.

It should be made clear that, alternatively, all or part of the beads of fusible material may also be initially formed on the connection points of the substrate plate 100, rather than on those of the connection support 200.

Definitive connection between the beads of fusible material and the connection points is brought about by raising the temperature of the assembly to a temperature that is sufficient to melt the material of the beads. This material is then soldered onto the connection points which are wetted by the fusible material.

Figure 6:
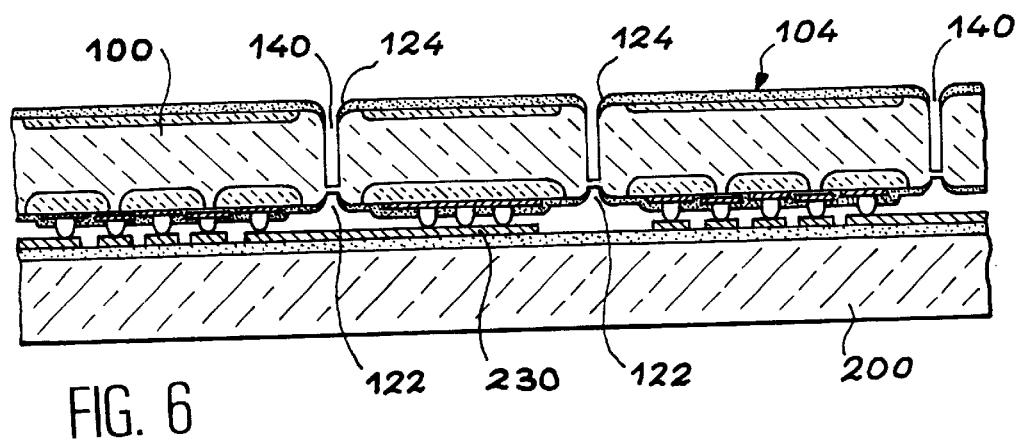
FIG. 6 is a diagrammatic section of the structure in FIG. 5, illustrating a step of forming trenches in the substrate plate.

The following step of the method, illustrated by FIG. 6, comprises the formation of trenches 140 in the substrate plate. These trenches surround the components 110a, 110b, 110c.

The trenches are made, for example, by sawing, starting from the back face 104 of the substrate plate and coincident with the grooves 122, 124 which were previously formed. Alternatively, the flaring grooves, and particularly the flaring grooves 124 on the back face may be formed after the trenches.

In the example described, the trenches are made first by sawing and then by dry etching. The figure shows trenches that do not pass right through, made by sawing and having a residue of material in the bottom of the trenches. This residue of material is then removed by the dry etching to provide trenches that do pass right through.

Producing trenches by etching allows one to avoid having to have precise control over the sawing depth, without the risk of damaging the tracks 230 of the connection support 200 just underneath.

Other techniques, such as cutting techniques using a water jet and/or a laser can also be used to form the trenches.

Figure 7:
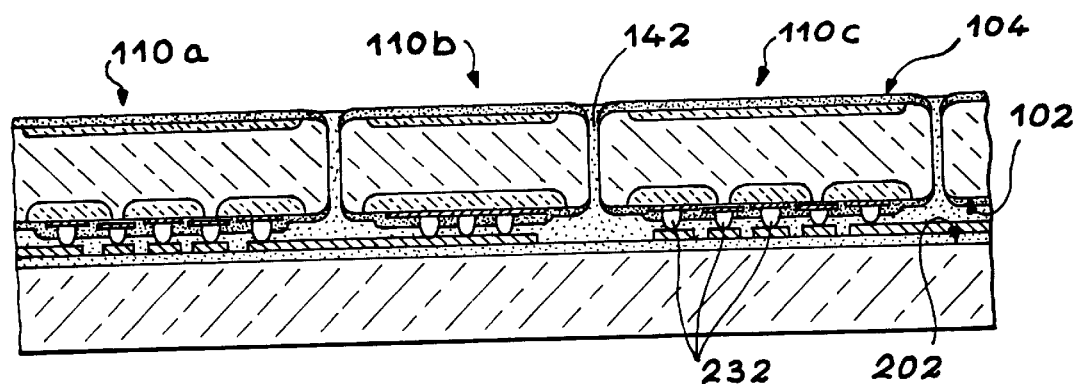
FIG. 7 is a diagrammatic section of the substrate plate an the connection support illustrating the placing of a dielectric material in the trenches.

FIG. 7 shows filling of the trenches with a dielectric material 142. The material used is preferably a material that is initially liquid which can be solidified, such as, for example, a polymer material, sol-gel or epoxy resin. It can be introduced in the liquid state and then solidified.

It may be observed that the dielectric material not only fills the trenches but also extends between the front faces 102, 202 of the substrate plate and the connection support in such a way that the connection beads are enveloped.

The dielectric material allows one to ensure over the long-term, the quality of the mutual electrical insulation between the components and the insulation of the components with respect to the connections support 200.

In the example illustrated, the filling of the trenches is such that the dielectric material 142 is exactly flush with the back face 104 of the substrate plate. The dielectric material may also overflow onto the back face of the substrate plate to create an extra passivation layer. Furthermore, the excess dielectric material on the back face may also be removed by polishing.

According to one particular embodiment of the method, the components can be tested and, possibly, any defective components can be replaced by other sound components before the dielectric material is put in place. In the same way, components produced in other substrate plates and by other production techniques can be introduced in place of or between components of the initial substrate plates. These components are also put into place before the dielectric material.

Figure 8:
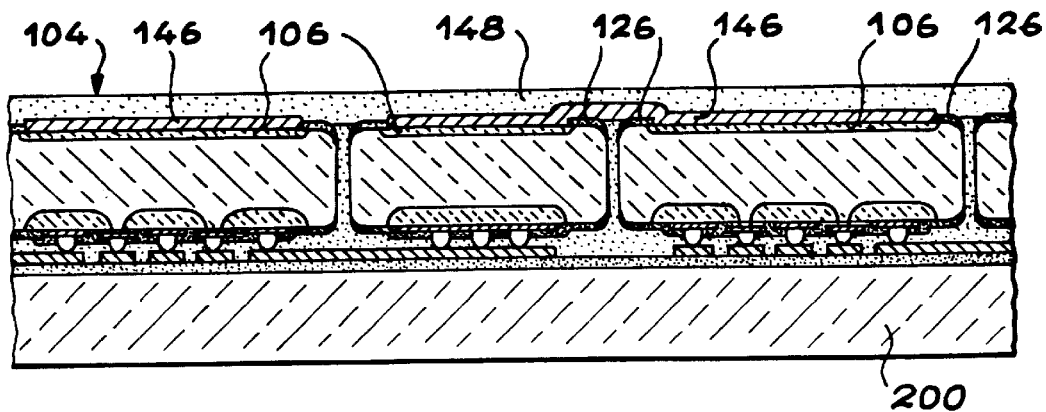
FIG. 8 is a diagrammatic section of a structure conforming to that in FIG. 7 illustrating the creation of interconnection tracks on the "back" face of the substrate plate.

FIG. 8 shows the formation of conducting interconnection tracks 146, on the back face 104 of the substrate plate, which allow connections to be made between certain components.

The creation of interconnection tracks is preceded by the formation of openings in the passivation layer 126 of the back face, which enable one to access, for example, doped regions 106.

A metal layer is then formed on the whole of the back face 104, and then etched in accordance with a pattern that enables one to create the conducting tracks 146. This tracks connect together doped regions of different components situated, for example, in different portions of the substrate plate.

A new dielectric passivation layer 148 is then formed on the free surface of the back face to protect the conducting tracks.

Openings can be made in the new passivation layer so as to create contact points on the conducting tracks. These points are not shown in the Figures.

Figure 9:
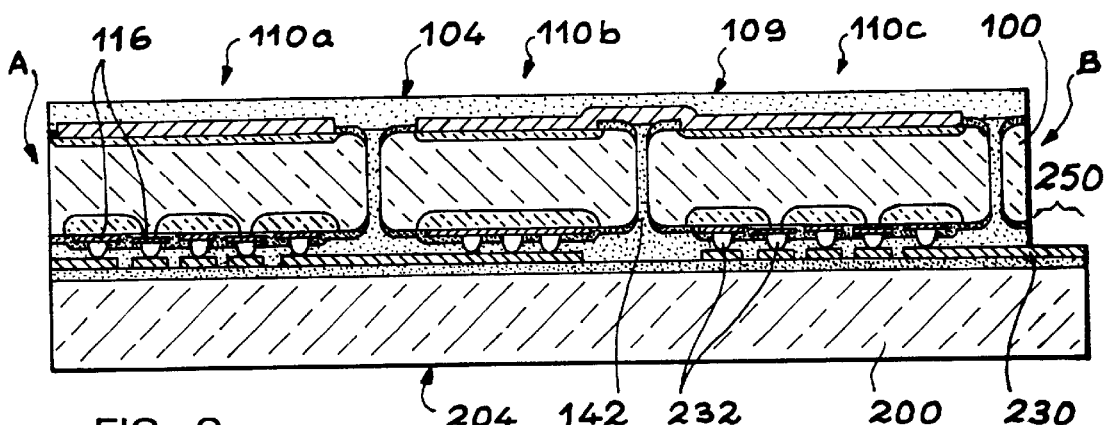
FIG. 9 is a diagrammatic section of the structure in FIG. 8 and illustrates a cutting operation carried out, on the substrate plate and the connection support.

After carrying out the treatment steps described above, the substrate plate and the connection support can be cut in order to individualize each of the modules formed FIG. 9 illustrates such a module comprising components 110a, 110b and 110c.

The cutting can be carried out with a saw with a straight blade which allows one to cut the substrate plate and the connection support along one and the same cutting plane, marked by reference A on the left hand side of FIG. 9.

The cutting of the substrate plate and the connection support can also be carried out with a saw with a stepped blade. Such a blade allows one to make a saw cut in the substrate and the connection support that is offset. The cut obtained by an offset cut is designated by reference B in FIG. 9.

The offset saw cut is turned to good account in order to bare a projecting part 250 of the connection support into which extend portions of conducting track 230 which are also connected to components by beads of fusible material.

Conducting connecting wires can be connected to the tracks in the bared part 250 in order to connect components of the module to other external equipment (this equipment like the conducting wires is not shown).

This feature allows one to reduce the number of contact sockets to be produced on the rear faces 104, 204 of the substrate plate and/or of the connection support, and therefore frees up space on these faces for the possible location of thermal dissipation radiators.

The description above describes a particular advantageous mode of implementing the invention in which electrical connections between the substrate plate and the connection support are produced using beads or bosses of fusible material. However, according to other possibilities for the implementation of the method, the electrical connections can be made by eutectic soldering between the connection points or using an anisotropic conducting adhesive placed between the substrate and the support. The anisotropic conducting adhesive allows one to only pass current along lateral directions within the space between the substrate and the support.

Furthermore, the beads of fusible material or other means of connection, can be housed in a depression 252 made in the front face of the connection support 200. In this case, the substrate plate transferred onto the connection support can rest on the front face of the connection support 202 around the depression.

Figure 10:
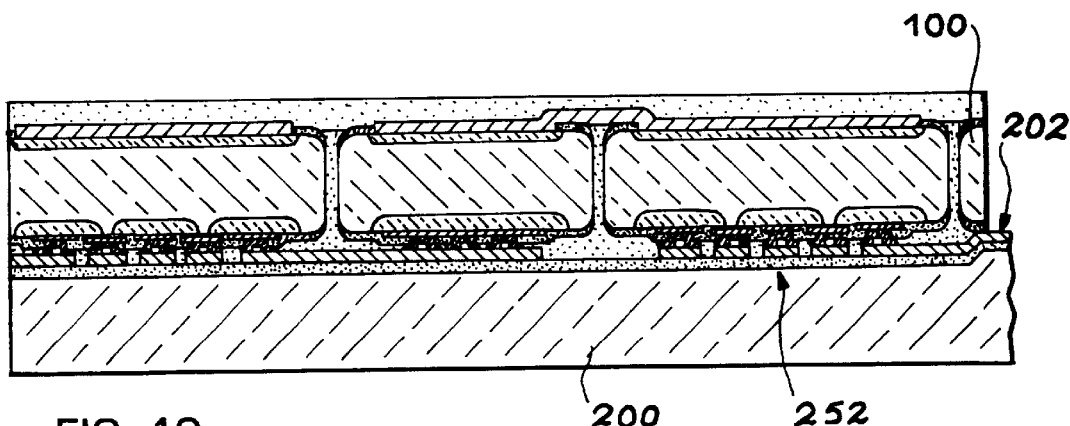
FIG. 10 is a diagrammatic section of a structure similar to that in FIG. 9, obtained according to another possible embodiment of the method of the invention.

This variant is shown in FIG. 10. FIG. 10 also shows a particular way of producing connection points on the substrate plate 100 for eutectic soldering on the points on the support plate 200.

A metallic or eutectic deposit on the points of the substrate plate enables one to make electrical contact with the surface on the extreme outside, by enlarging the point before carrying out the transfer onto the support.

What is claimed is:

1. Method of producing an integrated circuit comprising a plurality of electronic components, the method comprising the following successive steps:
   a) forming a plurality of components in a substrate plate, and forming connection points for said components on a first face of the substrate plate;
   b) forming a connection support of conducting tracks in accordance with a pattern that corresponds with a distribution of connection points on the substrate plate;
   c) transferring the substrate plate onto the connection support electrically connecting the connection points with corresponding conducting tracks;

d) forming at least one separation trench in the substrate plate, surrounding at least one portion of substrate including at least one electronic component, in a way that separates it from other components of the substrate plate, the trench passing right through the substrate plate without reaching the connection support, and e) filling the trenches with a dielectric material.

2. Method according to claim 1, additionally comprising, after step e), cutting the substrate plate and the connection support to form individual modules each comprising at least one component.

3. Method according to claim 1, in which step a) comprises the formation of at least one power component among said plurality of components, and in which during step d) at least one trench is formed that surrounds a portion of substrate that includes said power component.

4. Method according to claim 1, in which, before step c), grooves are formed in the substrate plate for flaring the trenches, in locations intended for the formation of the trenches during step d).

5. Method according to claim 1, in which, during step e), the connection points and the conducting tracks are connected by a fusible material.

6. Method according to claim 1, in which, during step e), the connection points and the conducting tracks are connected through a conducting adhesive.

7. Method according to claim 1, in which, during step e), the connection points and the conducting tracks are connected by eutectic soldering.

8. Method according to claim 1, in which the connection points and the conducting tracks are connected using bosses of fusible material and in which the dielectric material introduced through the trenches is caused to penetrate between the substrate plate and the connection support, so as to envelope said bosses.

9. Method according to claim 1, and also comprising the step of forming interconnection tracks on a second free face of the substrate plate, opposite said first face, said forming of interconnection tracks taking place after step e).

10. Method according to claim 1, in which said trench is formed by sawing and/or by etching.

11. Method according to claim 1, additionally comprising the step of laying bare a part of the connection support, into which at least one conducting track extends, which is connected to at least one of the components.

12. Method according to claim 1, additionally comprising, before step e), the steps of transferring and connecting onto the connection support of at least one component produced in a substrate other than said substrate plate.

* * * * *